United States Patent [19]

Nagatomi et al.

[11] Patent Number: 4,832,983
[45] Date of Patent: May 23, 1989

[54] PROCESS FOR PRODUCING METALLIZED PLASTIC FILM

[75] Inventors: Kyosuke Nagatomi; Teruki Kajiwara, both of Fukuoka; Hisashi Ookuma, Iizuka; Ryo Tachibana, Nishinomiya, all of Japan

[73] Assignee: Shizuki Electric Co., Inc., Nishinomiya, Japan

[21] Appl. No.: 21,942

[22] Filed: Mar. 5, 1987

[51] Int. Cl.⁴ .............................................. B05D 5/12
[52] U.S. Cl. .................... 427/81; 427/177; 427/250; 427/282; 427/363; 427/365; 427/256; 427/372.2; 427/428
[58] Field of Search .............. 427/81, 177, 250, 428, 427/363, 365, 256, 282, 372.2; 29/25.41, 570; 118/721

[56] References Cited

U.S. PATENT DOCUMENTS

| | | | |
|---|---|---|---|
| 2,892,241 | 8/1959 | Charlton | 118/721 |
| 3,278,322 | 10/1966 | Harkins | 427/365 |
| 3,895,129 | 7/1975 | Craig | 427/81 |
| 4,224,362 | 9/1980 | Ramsauer | 427/256 |
| 4,243,708 | 1/1981 | Eustance | 427/81 |
| 4,309,810 | 1/1982 | Drake | 427/250 |
| 4,365,423 | 12/1982 | Arter | 427/372.2 |
| 4,503,801 | 3/1985 | Collishaw | 427/428 |

FOREIGN PATENT DOCUMENTS 2652438  5/1978  Fed. Rep. of Germany ...... 427/282

Primary Examiner—Shrive Beck
Assistant Examiner—Vi Duong Dang
Attorney, Agent, or Firm—Armstrong, Nikaido, Marmelstein, Kubovcik & Murray

[57] ABSTRACT

A process for producing a metallized plastic film comprising the steps of applying a masking oil supplied from an oil supply source to the surface of a rubber roll drivingly in rotation and having formed on its surface projections or indentations in conformity with the margin pattern to be formed, applying the masking oil on the surface of the rubber roll to the surface of a plastic film in a pattern substantially similar to the margin pattern, and forming a vacuum-evaporated metal film on the oil bearing surface of the plastic film. Margins can be formed in a desired pattern efficiently by this process.

3 Claims, 6 Drawing Sheets

PROCESS FOR PRODUCING METALLIZED PLASTIC FILM

BACKGROUND OF THE INVENTION

The present invention relates to a process for producing a metallized plastic film, and more particularly to a process for producing a metallized plastic film by coating one surface or both surfaces of a plastic film, such as polyester film or polypropylene film, with zinc, aluminum or like metal by vacuum evaporation.

Metallized film capacitors are fabricated by rolling up or laminating such a metallized plastic film. The metallized plastic film used for this purpose is in the form of a strip and is formed on the metal-deposited side thereof with a narrow margin extending along one longitudinal side edge thereof and left uncoated with the deposited metal.

The known methods for forming such a margin include the tape margin method and the oil margin method. With the former tape margin method, a plastic film is subjected to a vacuum evaporation treatment as partially covered with an endless tape of small width over a film portion corresponding to the margin to form an area where no metal is deposited. The latter oil margin method resorts to the property of the vapor of metal that it is unable to deposit on an area bearing condensed oil, such that an oil vapor is continuously applied for condensation to the area where a margin is to be formed, followed by vapor evaporation of metal. These methods are used for forming a longitudinal margin of specified width on films along one side edge thereof.

In recent years, capacitors are placed into use in which the film is formed with margins of specified width extending transversely thereof so as to assure the capacitor of sustained performance, as disclosed for example in Unexamined Japanese Patent Publication No. 58-222517. This is attributable to the following reason. In the case where metal is deposited over the entire area of the film, a breakdown, if occurring locally, permits a continuous flow of great current into the breakdown portion from the neighborhood to gradually enlarge the defective portion, consequently impairing the performance of the capacitor. To preclude such phenomena, the deposited metal electrode is divided into many small unit areas so as to restrict a break in the electrode at one location to the small unit area including the broken portion and to maintain the performance of the capacitor by preventing further development of the break. Transverse margins are therefore formed in order to divide the deposited metal electrode into such small unit areas.

However, the conventional tape margin method or oil margin method is not suitable for forming margins which extend transversely of the film although these methods are usable for forming longitudinal margins on the film. Accordingly, Unexamined Japanese Patent Publication Nos. 57-118623, 57-120328, 57-164521 and 58-15220 and Unexamined Japanese Utility Model Publication 57-53635, for example, disclose a method of forming margins by removing the deposited metal electrode by spark discharge. With reference to FIG. 6 showing an arrangement for practicing this method, an electrode roller 52 has an electrode portion 51 having a small width and extending transversely of a film 54. The roller 52 and a current supply roller 53 are rotated on a deposited metal electrode film 55 formed on the film 54, with a voltage applied across the two rollers 52, 53 from a power supply 56. The electric energy at the portion of contact between the electrode film 55 and the electrode portion 51 forcibly removes the deposited metal from this portion opposed to the electrode portion 51, whereby a margin 57 is formed transversely of the film 54.

The above margin forming method utilizing spark discharge has the following drawbacks. First, it is impossible to give a very small width to the electrode portion of the electrode roller in view of durability, whereas it is also impossible to form the electrode portion with a greatly increased width in view of the need to assure a certain level of energy density. These limitations consequently impose limitations on the width of margins that can be formed, presenting difficulty in forming an exquisite margin pattern.

Second, the speed at which the margin is formed is lower than the speed of vacuum evaporation treatment for the film, giving rise to the necessity of forming the margin by a process separate from the vacuum evaporation process and failing to achieve a high production efficiency.

Further the use of spark discharge involves difficulty in completely removing the deposited metal.

SUMMARY OF THE INVENTION

Accordingly, the main object of the present invention is to provide a process for producing a metallized plastic film by which margins can be formed in a desired pattern with a high production efficiency.

Another object of the invention is to provide a process for producing a metallized plastic film by which margin patterns can be formed with improved sharpness.

To fulfill these objects, the process of the present invention for producing a metallized plastic film comprises the steps of:

a. applying a masking oil supplied from an oil supply source to the surface of a rubber roll drivingly in rotation and provided on its surface with a pattern of projections corresponding to the margin pattern to be formed, b. applying the masking oil on the surface of the rubber roll to the surface of a plastic film in a pattern substantially similar to the margin pattern, and c. forming a vacuum-evaporated metal film on the plastic film surface having the masking oil applied thereto.

Thus, a masking oil is applied in a specified pattern to the surface of a plastic film with a rubber roll which has a pattern of projections on its surface, whereby the desired margins can be formed. Accordingly, when a suitable pattern of projections is selected, margins can be formed in the desired pattern efficiently.

According to a preferred mode of embodying the present invention, an oil for use in evacuating systems in an atmosphere of reduced pressure of $10^{-2}$ to $10^{-5}$ torr is used as the masking oil. According to another preferred mode of practicing the present invention, the film of oil applied to the surface of the plastic film is 2 to $5 \times 10^3$ angstroms in thickness. According to another preferred mode of embodying the invention, the rubber roll is brought into direct contact with the surface of the plastic film.

These modes of embodying the invention serve to form margin patterns with improved sharpness as contemplated by the invention.

DESCRIPTION OF THE PREFERRED EMBODIMENTS

The process of the present invention for producing a metallized plastic film will be described below in detail with reference to specific embodiments and to the accompanying drawings.

Figure 1:
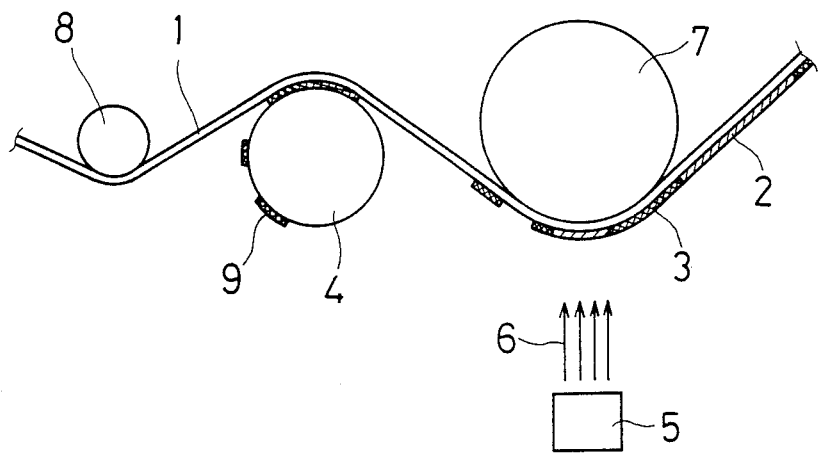
FIG. 1 is a diagram illustrating an example of apparatus for use in practicing the process of the invention for producing a metallized plastic film.

FIG. 1 is a diagram showing how margins are formed on a film by an engraved rubber roll 4.

With reference to the drawing, a plastic film 1, such as polyester film or polypropylene film, is sent forward around a guide roller 8. The engraved rubber roll 4 has a margin pattern 9 bearing an oil film on its surface.

The film 1 forwarded by the guide roller 8 is brought into contact with the engraved rubber roll 4 before a vacuum evaporation step, whereby the oil film in the form of the margin pattern 9 is printed on the film 1 as indicated at 3. The film 1 bearing the print of margin pattern 3 is brought to a position above an evaporation source 5 for metal vacuum evaporation, in intimate contact with a cooling roll 7. The evaporation source 5 is evaporating an electrode material 6, such as zinc or aluminum, at all times, so that the metal is deposited on the portion of the film 1 positioned above the source 5 and cooled by the cooling roll 7.

At this time, the metal is not deposited on the margin pattern which is in the form of an oil film. In this way, a vacuum-evaporated metal electrode 2 and margins 3 are formed on the film 1 passing over the evaporation source 5.

With the margin pattern forming method of the present invention, the engraved rubber roll 4 is disposed in the vicinity of the evaporation source 5 in an atmosphere of reduced pressure of $10^{-2}$ to $10^{-5}$ torr, because the metal must be deposited before the oil film on the film 1 dries although the oil film needs to dry and disappear immediately after vacuum evaporation, also because the margin pattern will not be formed with good stability if the oil film dries before the deposition of metal.

Figure 2:
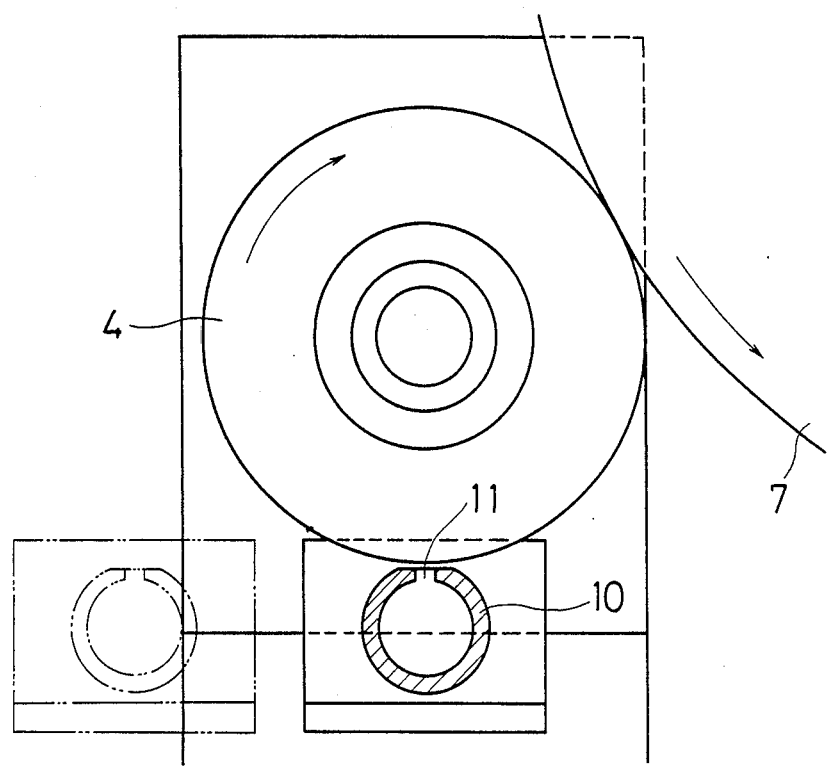
FIG. 2 is a diagram on an enlarged scale showing an arrangement around a rubber roll included in the apparatus.

FIG. 2 shows in detail an arrangement including the engraved rubber roll 4. As illustrated, an oil supply hollow cylinder 10 for supplying the oil to the rubber roll 4 is disposed immediately below the roll 4. The oil supply cylinder 10 is formed in its top wall with oil orifices 11 equidistantly spaced axially of the cylinder 10. Although not shown, the cylinder 10 is provided with oil heating means, such that hot oil vapor is continuously forced out from the oil orifices 11 and deposited on the surface of the engraved rubber roll 4. It is also possible to supply the oil from the cylinder 10 utilizing static pressure. It is to be noted that the thickness of the oil film is one of the important factors for drawing a sharp pattern. We have found that the oil film, if having a large thickness, results in problems, such as insufficient drying of oil and spread of oil, that would degrade the pattern. Accordingly, it is required that the oil have such properties as to form a film having a thickness of 2 angstroms to $5 \times 10^3$ angstroms in a vacuum of $10^{-2}$ to $10^{-5}$ torr. Examples of oils fulfilling this requirement and usable as the masking oil are pump oils and synthetic oils for use in diffusion pumps, ejector pumps, etc. in evacuating systems in a vacuum of the above range.

Figure 5A:
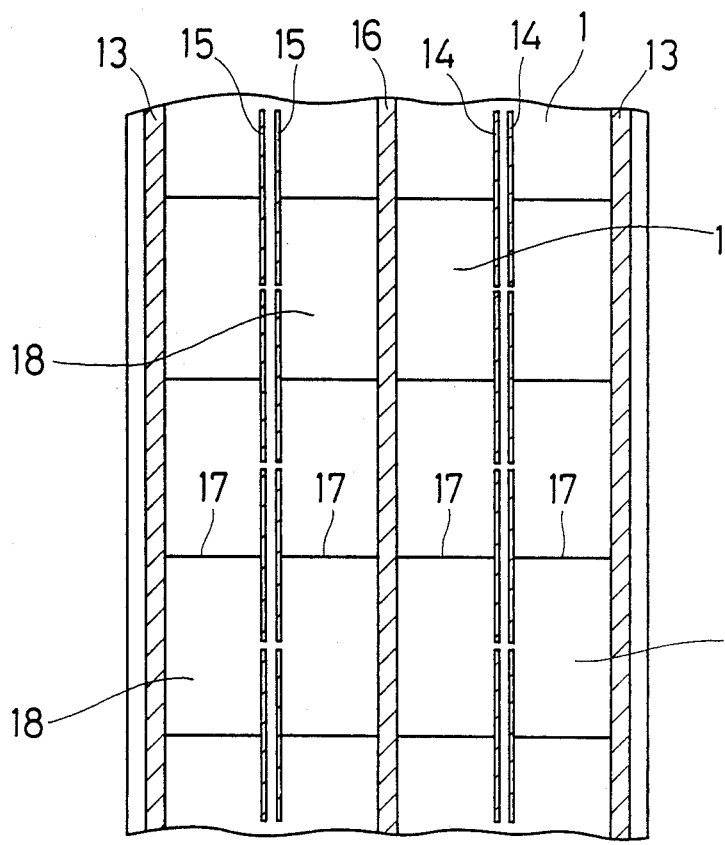
FIG. 5a is a plane view showing an example of margin pattern to be formed on a metallized plastic film.
Figure 5B:
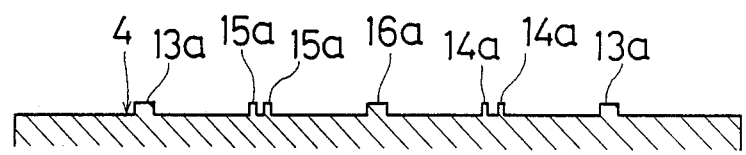
FIG. 5b is a fragmentary sectional view showing an example of rubber roll for forming the margin pattern.
Figure 6:
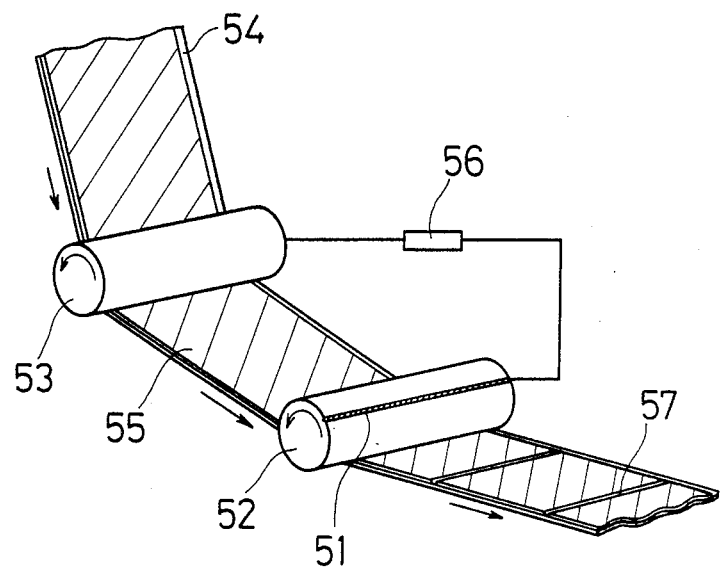
FIG. 6 is a diagram for illustrating a conventional margin forming method.

FIG. 5a shows an example of margin pattern to be formed on the surface of the plastic film 1. FIG. 5b shows in section an example of rubber roll 4 for use in forming the pattern. With reference to FIG. 5a, the margin pattern comprises a pair of margins 13, 13 extending longitudinally of the plastic film 1 at its opposite sides, two pairs of margins 14, 14 and 15, 15 of reduced width positioned inwardly of the margins 13, 13 and discretely extending longitudinally of the film, a longitudinal margin 16 at the center, and margins 17 extending transversely of the film and arranged at a suitable spacing. These margins divide the metal electrode film into small unit areas 18. On the other hand, the rubber roll 4 is provided with projections 13a to 16a corresponding to the margins 12 to 16, respectively, as shown in FIG. 5b (projections for the margins 17 not shown). The rubber roll 4 is made of a material suitably selected from among rubbers having heat resistance (e.g. about 200° C.) and also resistant to oils, abrasion and solvents. Preferably, the projections 13a to 16a are formed by engraving using a laser. It is then possible to form lines as thin as about 0.1 mm and to form patterns with still improved sharpness.

Figure 3:
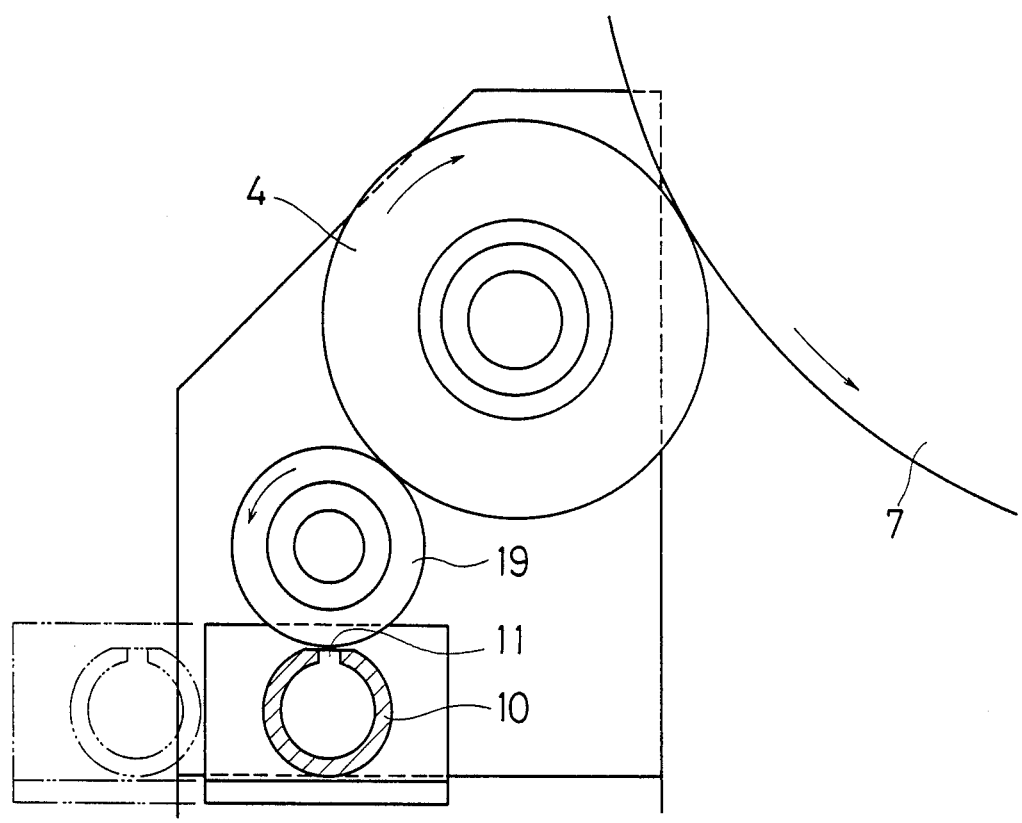
FIG. 3 is a diagram showing a modification of the arrangement including the rubber roll.

FIG. 3 shows a modified arrangement including the rubber roll 4. Oil is supplied from the supply cylinder 10 to an oil supply roll 19, which in turn feeds the oil to the rubber roll 4. Although not shown, the oil is fed out from the cylinder 10 utilizing oil heating means or static pressure in this case. The latter system, if used, eliminates the need for the oil heating means, serving to simplify the production process and reducing the labor required for the production.

Figure 4:
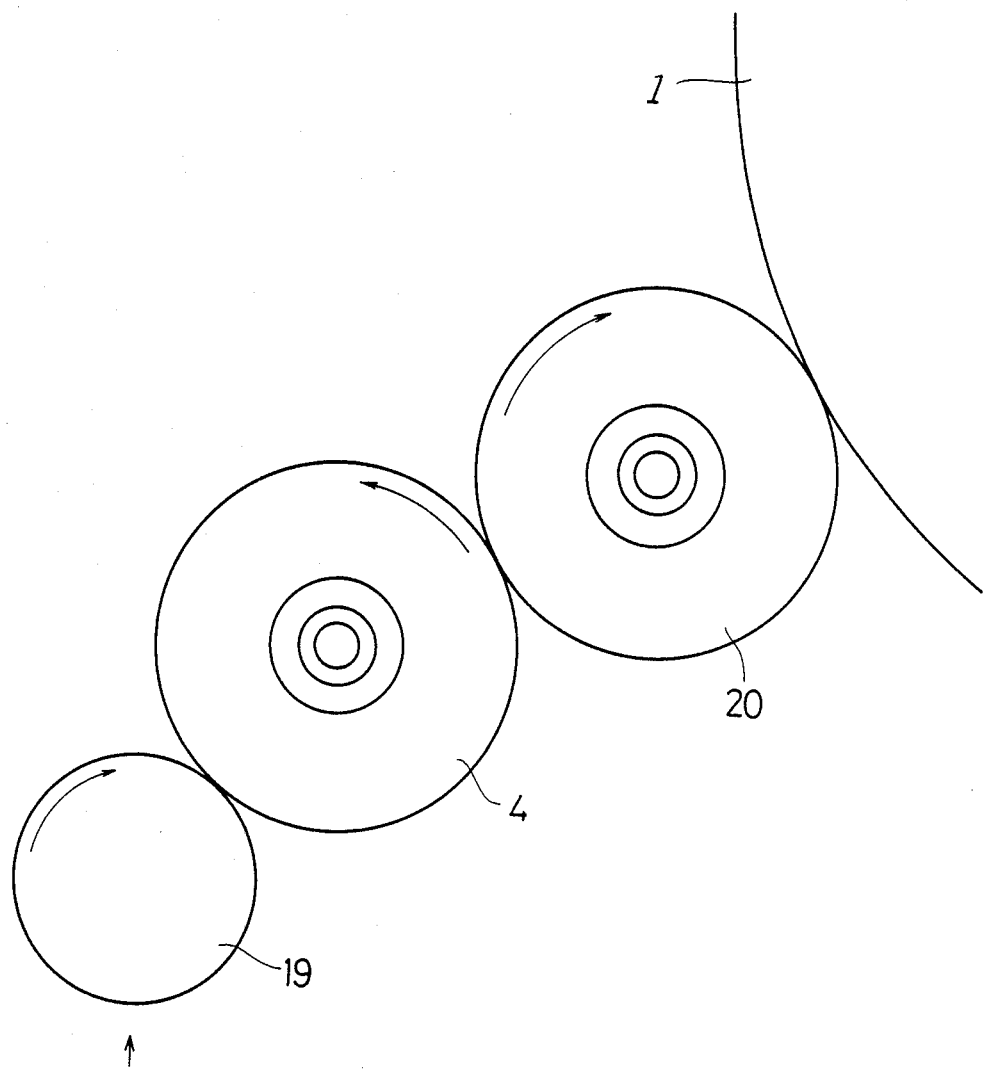
FIG. 4 is a diagram showing another modification of the rubber roll arrangement.

FIG. 4 shows another modified arrangement including the rubber roll 4. This arrangement comprises the same oil supply roll 19 as in the above modification and a transfer rubber roll 20 to which the oil applied to the rubber roll 4 is transferred. The roll 20 then applies the oil to the plastic film 1. The present process can be practiced by this arrangement.

Although the margin pattern forming method of the invention has been described above for use in the fabrication of metallized film capacitors, the present invention is not limited to such application but is also useful, for example, for forming intricate patterns of ornamental vacuum-evaporated films.

What is claimed is:

1. A process for producing a metallized plastic film comprising a patterned coating of a metal provided on a plastic film, said method comprising the steps of:
  (a) applying to the outer surface of a rotating rubber roll a masking oil selected from the group consisting of oils which have such evaporation characteristics so as to be suitable for use in an evacuation systems wherein a pressure of $10^{-2}$ to $10^{-3}$ torr is maintained, said outer surface of the rubber roll being provided with a pattern of projections and indentations;

(b) transferring the masking oil present on the surface of the projections on the rubber roll to a continuously moving plastic film to form an oil pattern on the plastic film, wherein sufficient oil is applied in step (a) to the rubber roll in order for the thickness of the oil pattern on the plastic film to be in the range of 2 angstroms to $5 \times 10^3$ angstroms;

(c) immediately subjecting the plastic film coated with said oil pattern to a process of vacuum evaporation and deposition of a metal, wherein the presence on the plastic film of the oil having said evaporation characteristics and said thickness prevents said metal from depositing on the portions of the surface of the plastic film which are coated with oil, whereby a film of said metal is deposited only on the portions of the surface of the plastic film which are not coated with said oil; and (d) after the deposit of the metal film, allowing the oil present in the form of a pattern on the surface of the plastic film to evaporate completely, whereby a patterned metal coating remains on the surface of the plastic film.

2. A process as defined in claim 1, wherein the rubber roll is brought into direct contact with the surface of the plastic film to form an oil pattern.

3. A process as defined in claim 1, wherein said rubber roll is brought into contact with a second rubber roll which has a smooth surface, whereby said oil pattern is transferred to the second rubber roll, and then said second rubber roller is brought into contact with said surface of the plastic film whereby said oil pattern is transferred onto said surface of the plastic film.

* * * * *